United States Patent [19]

Yee

[11] Patent Number: 4,689,499

[45] Date of Patent: Aug. 25, 1987

[54] UNIVERSAL CURRENT SOURCE AND CURRENT SINK SENSOR INTERFACE

[75] Inventor: Jimmy Yee, Rockford, Ill.

[73] Assignee: Honeywell Inc., Minneapolis, Minn.

[21] Appl. No.: 759,613

[22] Filed: Jul. 25, 1985

[51] Int. Cl.$^4$ .............................................. H03K 5/153
[52] U.S. Cl. .................................... 307/360; 307/236; 307/311; 307/475
[58] Field of Search ............... 307/350, 360, 236, 311, 307/475

[56] References Cited

U.S. PATENT DOCUMENTS

| | | | |
|---|---|---|---|
| 3,725,795 | 4/1973 | Mesenhimer | 307/360 |
| 4,292,552 | 9/1981 | Tanaka | 307/360 |
| 4,382,198 | 5/1983 | Ishijima et al. | 307/360 |

Primary Examiner—John Zazworsky
Attorney, Agent, or Firm—Charles L. Rubow

[57] ABSTRACT

An electronic circuit for interfacing a sensor of either current sourcing or current sinking type to a data bus requiring signals of predetermined characteristics, the circuit including first and second level comparators set to different reference levels so as to define a window between the reference levels at which neither comparator is actuated. A sensor input terminal is biased to a level between the reference levels of the comparators, but varies to a level outside the window in response to current flowing from or into the sensor terminal. The comparator output terminals are connected to an output circuit which produces a signal suitable for transmission on the data bus in response to actuation of either comparator.

11 Claims, 2 Drawing Figures

UNIVERSAL CURRENT SOURCE AND CURRENT SINK SENSOR INTERFACE

BACKGROUND OF THE INVENTION

The invention disclosed herein relates generally to circuitry for providing an interface between sensors and a data bus, and more particularly to such circuitry capable of accepting inputs from both current sourcing and current sinking type sensors.

Programmable controllers are being increasingly used in a variety of industrial and other applications. Such controllers typically employ one or more microprocessors which must receive data signals having predetermined characteristics from a data bus. Signals on the data bus may be derived from a variety of sensors and other devices which produce various types of output signals whose characteristics generally do not meet the microprocessor data input signal requirements. Therefore, a suitable interface circuit must be used between each sensor or other input device and the data bus.

Two types of sensors are common. These comprise current sinking sensors which vary the current supplied by a current source in accordance with a sensed parameter, and current sourcing sensors which supply a variable current depending on a sensed parameter.

A variety of interface circuits are known for connecting either type of sensor to a data bus. Interface circuits for programmable controllers are also known which are provided with a selector switch permitting the user to select the proper interface circuit operating mode for either a current sinking or current sourcing input. Under this approach the installer is required to determine the transducer output type. The installer may or may not have the electronic capability and familiarity to correctly make this determination.

A similar potential problem occurs when a sensor is changed due to either a malfunction or changing application requirements. In this situation, the problem may be somewhat aggravated because the person doing the maintenance or modification work may be someone other than the original installer, and may be even less familiar with the types of sensor outputs.

Yet a further problem may occur in the common situation in which a particular application requires sensors of both types. Conventionally, interface circuits are available in modules of four or eight channels per module. If an application requires sensors of both types in other than multiples of four or eight sensors of each type, the cost of and a space required by the interface modules will be unnecessarily increased.

The foregoing problems or inconveniences are eliminated by the applicant's invention which makes each interface channel capable of indiscriminately accepting inputs from either current sourcing or current sinking type sensors or other input devices. Thus, the installer is not faced with the problem of selecting a proper interface channel for a particular input device, and may not even be required to know the type of the input device. In addition, utilization of the interface modules is maximized since separate modules are not required for current sourcing and current sinking type input devices.

SUMMARY OF THE INVENTION

The present invention is a circuit for interfacing apparatus of either current sourcing or current sinking type with a data bus. It basically comprises first and second level comparators, a reference level circuit for supplying at least one signal corresponding to a reference level, and an input terminal. The comparators are connected to the input terminal and the reference level circuit, and compares the level of an input signal to upper and lower reference levels. The comparators operate such that one comparator produces an output signal if current flows into the input terminal thereby producing a signal level above the upper reference level, and the other comparator produces an output signal if current flows from the input terminal thereby producing a signal level below the lower reference level. The comparator output terminals are connected to an output circuit which produces a signal having characteristics suitable for transmission on a data bus if either comparator produces an output signal.

The comparators may be either in the form of differential amplifiers which receive separate reference voltages or a pair of series connected complimentary bipolar transistors whose operating points are shifted in unison in a direction determined by the direction of current flow through the input terminal. The output circuit may include an optoelectronic isolator whose output stage is connected to the data bus.

DESCRIPTION OF THE PREFERRED EMBODIMENTS

Figure 1:
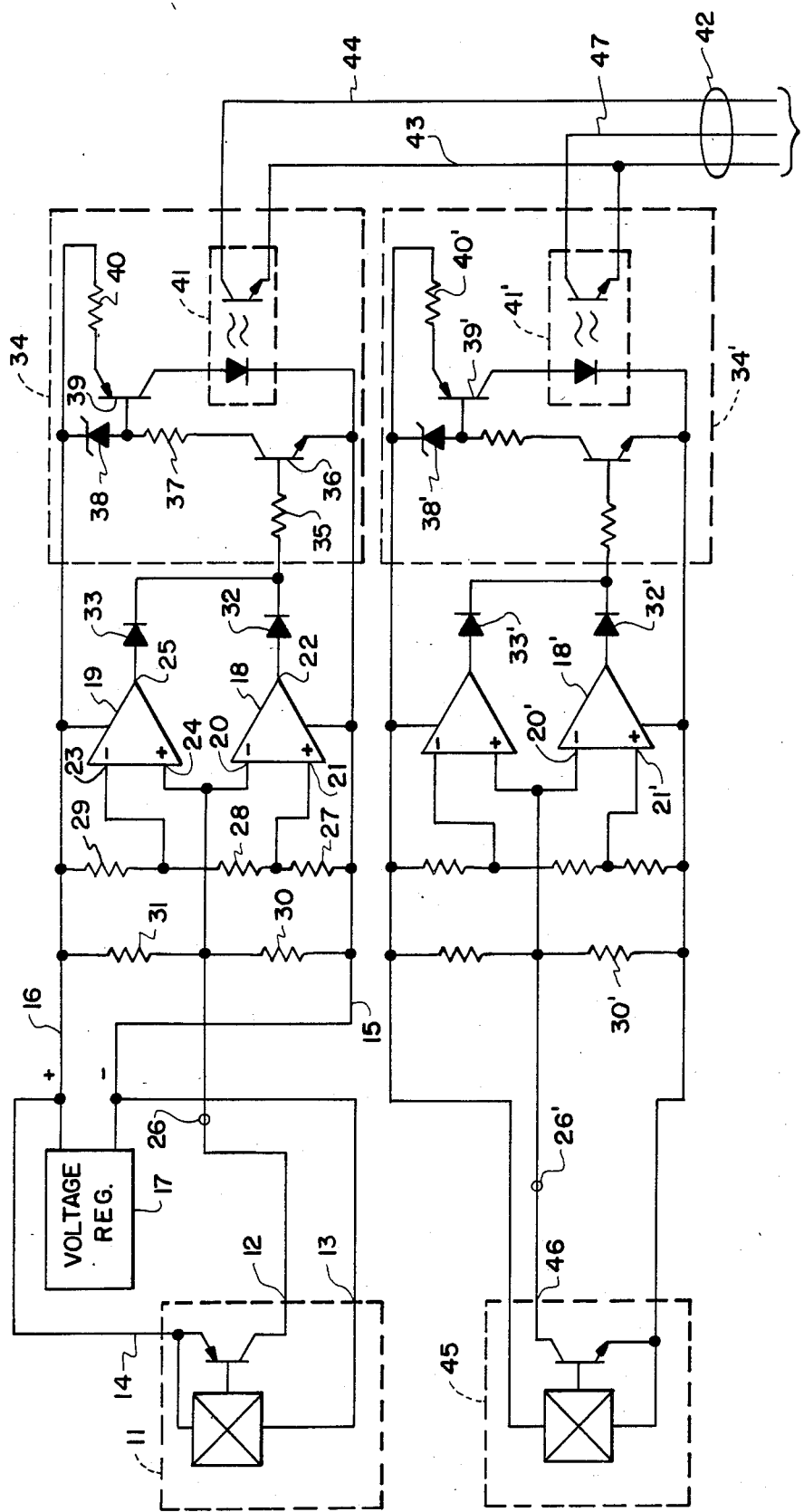
FIG. 1 is a partial view of a system including current sourcing and current sinking input devices, interface circuits in accordance with a first embodiment of the applicant's invention, and a data bus.

In the system shown in FIG. 1, reference numeral 11 identifies a sensor or input device of a type which has an output terminal 12 through which it supplies a current which varies depending on a condition of the device, accordingly referred to as a current sourcing device. Such current sourcing devices and analogous current sinking devices described hereinafter may be sensors which sense environmental or equipment parameters, or may be some other apparatus such as manually actuated switching mechanisms. For purposes of convenience, any such device will be referred to herein as a sensor.

Reference numerals 13 and 14 identify power supply terminals of sensor 11 which are connected to first and second electrical supply conductors 15 and 16 respectively of one interface channel in a module containing a plurality, e g , four or eight, of such channels. A module may contain an internal power supply such as identified by reference numeral 17 which receives unregulated power from a source not shown and supplies current at a substantially fixed voltage between conductors 15 and 16.

Reference numerals 18 and 19 identify first and second differential amplifiers used as comparators. Amplifier 18 includes inverting and noninverting input terminals 20 and 21 respectively and an output terminal 22. Similarly, amplifier 19 includes inverting and noninverting input terminals 23 and 24 and an output terminal 25. Inverting input terminal 20 of amplifier 18 and noninverting input terminal 24 of amplifier 19 are connected to an input terminal 26 to which output terminal 12 of sensor 11 is connected. A voltage divider including series connected resistors 27, 28 and 29 are connected between conductors 15 and 16.

Noninverting input terminal 21 of amplifier 18 is connected to the junction between resistors 27 and 28 which provide a first reference voltage. Inverting input terminal 23 of amplifier 19 is connected to the junction between resistors 28 and 29 which provide a second reference voltage.

A further voltage divider including resistors 30 and 31 is connected between supply conductors 15 and 16, and the junction between the resistors is connected to input terminal 26. Thus, amplifiers 18 and 19 are set to different reference voltages, thereby forming a voltage window in which neither amplifier provides an output signal. Input terminal 26 is biased by means of resistors 30 and 31 to a voltage between the reference voltages of the amplifiers.

Upon actuation of sensor 11, the sensor effectively lowers the impedance across resistor 31, thereby raising the voltage at amplifier terminals 20 and 24 to above the reference voltage at amplifier terminal 23. This results in an output signal from amplifier 19.

Reference numerals 32 and 33 identify diodes whose anodes are connected to amplfier output terminals 22 and 25 respectively. The cathodes of diodes 32 and 33 are connected together and to the input terminal of an output circuit shown in dashed line box 34. Output circuit 34 includes a resistor 35 connected between the interconnected cathodes of diodes 32 and 33 and the base of an NPN transistor 36 whose emitter is connected to conductor 15. The collector of transistor 36 is connected through a series connected resistor 37 and Zener diode 38 to conductor 16. Transistor 36 and resistors 35 and 37 form a control signal generator for a current regulator which drives an optoelectronic isolator. Specifically, the junction beween resistor 37 and Zener diode 38 produces a base control signal for a PNP transistor 39 which, through its emitter, produces a constant current drive signal for an optoelectronic isolator 41. The output section of isolator 41 is connected to a data bus 42. More spcificallly, the output section of isolator 41 is connected between a common conductor 43 and a further conductor 44 dedicated to sensor 11.

A second interface channel, substantially identical to the previously described interface channel is shown in the lower portion of FIG. 1. It includes a sensor 45 which differs from sensor 11 in that sensor 45 is a current sinking type sensor which, when actuated, draws current through its output terminal 46 from sensor input terminal 26'. Thus, sensor 45 effectively provides a lower impedance across resistor 30' and lowers the voltage at amplifier input terminal 20' to below the reference voltage at noninverting terminal 21', thus causing amplifier 18' to produce an output signal.

Diodes 32, 32' and 33, 33' respectively form signal selectors, each of which operates to select the output signal from the one of the amplifiers in an interface channel which is producing the highest signal, and to supply that signal to the input terminal of the output circuit. Thus, a signal is provided to output circuit 34, 34' upon actuation of the associated sensor regardless of whether the sensor is of a current sourcing or current sinking type.

The output signal of optoelectronic isolator 41' is supplied between common conductor 43 in data bus 42 and a further conductor 47 therein dedicated to sensor 45. Components 38, 38', 39, 39' and 40, 40' supply a constant current to the input section of optoelectronic isolator 41 so as to provide a suitably consistent output signal from the isolator.

Figure 2:
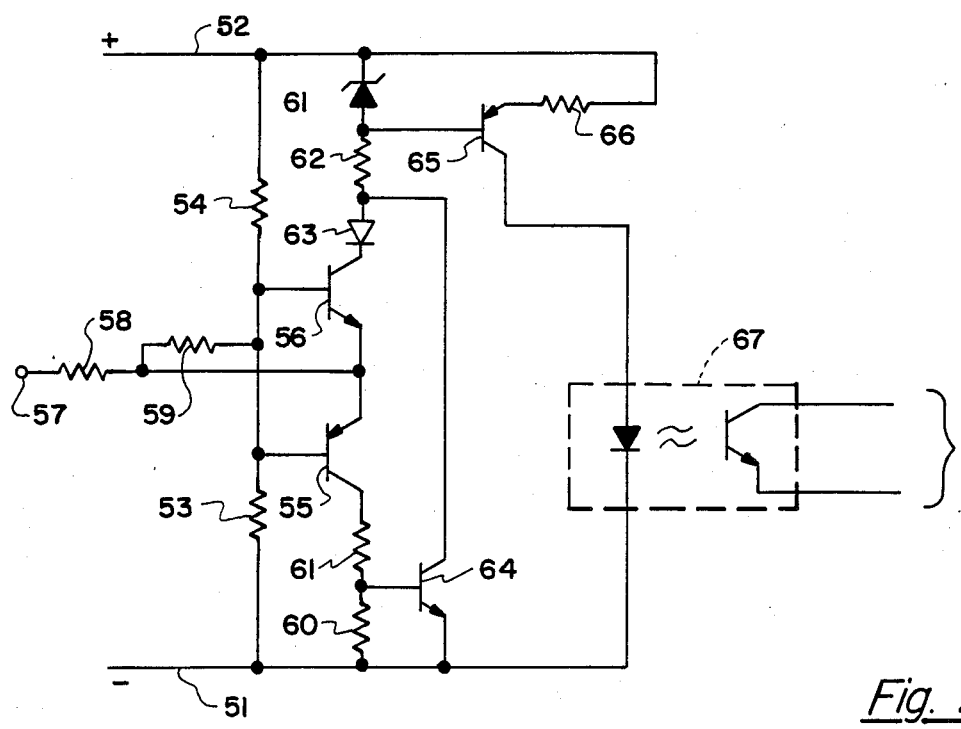
FIG. 2 is a second embodiment of an interface circuit in accordance with the applicant's invention.

In the embodiment of the applicant's interface circuit shown in FIG. 2, reference numerals 51 and 52 identify positive and negative or ground electrical supply conductors. A voltage divider comprising series connected resistors 53 and 54 is connected between conductors 51 and 52. A pair of complementary bipolar transistors including PNP transistor 55 and NPN transistor 56 are connected through suitable circuitry between conductors 51 and 52. For convenience, the bases of transistors 55 and 56 are sometimes referred to herein as cotrol electrodes, and the emitters and collectors of the transistors are sometimes referred to as primary electrodes.

The emitters of transistors 55 and 56 are connected to a sensor input terminal 57 through a resistor 58, and to the junction between resistors 53 and 54 through a resistor 59 which serves to bias the emitters of transistors 55 and 56 and sensor input terminal 57 to a predetermined voltage. The bases of the transistors are also connected to the junction between resistors 53 and 54 so as to provide the same voltage thereat.

The collector of transistor 55 is connected to conductor 51 through a voltage divider comprising series connected resistors 60a and 60b which form a biasing network. The collector of transistor 56 is connected to conductor 52 through a series connected Zener diode 61 having its cathode connected to conductor 52, a resistor 62, and a diode 63 having its cathode connected to the collector of transistor 56.

An NPN transistor 64 has its collector connected to the junction between resistor 62 and diode 63, its emitter connected to conductor 51 and its base connected to the junction between resistors 60a and 60b. Resistors 60a, 60b and 62 and transistor 64 form a control signal generator similar to that formed by resistor 35 and 37 and transistor 36 in the embodiment of FIG. 1. A current regulator for the embodiment of FIG. 2 includes diode 61 and a PNP transistor 65 having its base connected to the junction between Zener diode 61 and resistor 62, its emitter connected to conductor 52 through a resistor 66, and its collector connected to the input section of an optoelectronic isolator 67. The output section of the optoelectronic isolator is connected to a data bus as described in connection with the embodiment of FIG. 1.

The embodiment of FIG 2 operates such that with no sensor input signal, transistors 55 and 56 are biased so that neither transistor is conducting. However, if a sensor of the current sourcing type is connected to sensor input terminal 57 and is actuated, the voltage at the emitters of transistors 55 and 56 increases with respect to their base voltages. Transistor 56 remains nonconducting, but transistor 55 is made to conduct, thereby increasing the voltage at the base of transistor 64 so as to cause it to conduct and draw current through resistor 62. This raises the voltage at the junction between Zener diode 61 and resistor 62, and causes transistor 65 to conduct, thereby providing a constant current driving signal to optoelectronic isolator 67.

Conversely, if a sensor of a current sinking type is connected to sensor input terminal 57, upon actuation it will lower the voltage at the emitters of transistors 55 and 56. Transistor 55 will remain nonconducting. However, transistor 56 will conduct, thereby again drawing current through resistor 62 and increasing the base voltage of transistor 65.

In accordance with the foregoing description, the applicant has provided a unique interface circuit capable of accepting inputs from either current sourcing or current sinking type input devices and transforming the output signal of either type of device to a signal suitable for transmission on a data bus Althrough two specific embodiments have been shown and described for illustrative purposes, a variety of modifications and other embodiments within the applicant's contemplation and teaching will be apparent to those skilled in the relevant arts. It is not intended that coverage be limited to the disclosed embodiments, but only by the terms of the following claims.

The embodiments of the invention in which an exclusive property or right is claimed are defined as follows:

1. A circuit for interfacing sensor apparatus of either current sourcing or current sinking type with a data bus comprising:
   a sensor terminal adapted to have a sensor connected thereto;
   a reference level circuit for supplying at least one signal corresponding to a reference level;
   first and second level comparators;
   first connecting means connecting said first and second level comparators to said sensor terminal;
   second connecting means connecting said first and second level comparators to said reference level circuit, said comparators and said first and second connecting means being arranged such that when current flows into a sensor from said sensor terminal said first level comparator produces a characteristic output signal, and when current flows from a sensor into said sensor terminal said second level comparator produces a characteristic output signal;
   a current regulator operable to produce a constant current in response to the characteristic signal produced by either of said first and second level comparators; and
   an optoelectronic isolator having an input section connected to said current regulator so as to receive the constant current produced thereby and an output section adapted to be connected to a data bus.

2. The circuit of claim 1 wherein:
   said first and second level comparators each comprise a differential amplifier having noninverting and inverting input terminals and an output terminal at which is produced the characteristic output signal of the respective level comparator;
   said reference level circuit is operable to establish a first reference voltage at the noninverting input terminal of said first differential amplifier and a second reference voltage different from a first reference voltage at the inverting input terminal of said second differential amplifier;
   the inverting and noninverting input terminals of said first and second differential amplifiers respectively are connected to said sensor terminal through a conductor biased to a voltage between the first and second reference voltages; and
   a signal selector is included for selecting the output signal from the differential amplifier in the one of said first and second level comparators which is producing a characteristic output signal.

3. The circuit of claim 2 wherein said reference level circuit comprises:

first and second supply conductors for supplying electrical power at a substantially constant voltage between the conductors;
a first voltage divider including first, second and third series connected resistors between said first and second supply conductors, the junction between the first and second resistors being connected to the noninverting input terminal of said first differential amplifier and the junction between the second and third resistors being connected to the inverting input terminal of said second differential amplifier; and
a second voltage divider including fourth and fifth series connected resistors between said first and second supply conductors, the junction between the fourth and fifth resistors being connected to said sensor terminal.

4. The circuit of claim 1 wherein:
   said first and second level comparators comprise first and second bipolar transistors of complementary types, each of said first and second transistors having first and second primary electrodes and a control electrode, said first and second transistors having their first primary electrodes interconnected;
   said reference level circuit is operable to establish a reference voltage at the control electrodes of said first and second transistors;
   said sensor terminal is connected to the first primary electrodes of said first and second transistors through a conductor biased to the reference voltage, said first transistor being operable to conduct current through its first and second primary electrodes when current is supplied to said sensor terminal, and said second transistor being operable to conduct current through its first and second primary electrodes when current is drawn from said sensor terminal; and
   a control signal generator is connected to said first and second transistors and said current regulator, said control signal generator being operable to cause said current regulator to produce a substantially constant current whenever current is conducted through the first and second primary electrodes of said first transistor or said second transistor.

5. The circuit of claim 4 wherein said control signal generator includes:
   first and second supply conductors for supplying electrical power at a substantially constant voltage between the conductors;
   third connecting means connecting said first and second transistors through their primary electrodes between said first and second supply conductors, said third connecting means including a biasing network between said first transistor and said first supply conductor and a first resistor between said second transistor and said second supply conductor; and
   a third transistor having first and second primary electrodes and a control electrode, the control electrode being connected to the biasing network, said third transistor being connected through its primary electrodes between said first resistor and said first supply conductor, said control signal generator operating such that conduction of said first transistor causes conduction of said third transistor to generate a control signal, and conduction of said second transistor directly causes current to flow through said resistor to generate a control signal.

6. The circuit of claim 5 wherein said reference level circuit includes second and third series connected resistors between said first and second supply conductors, the junction between the second and third resistors being connected to the control electrodes of said first and second transistors and, through a fourth resistor, to the conductor connecting the sensor terminal and the first primary electrodes of said first and second transistors.

7. The circuit of claim 3 further including a regulated source connected to said first and second supply conductors to provide the substantially constant voltage therebetween.

8. A circuit for transforming signals produced by a sensor of either current sourcing or current sinking type into signals suitable for transmission on a data bus comprising:
   first and second voltage comparators each having inverting and noninverting input terminals and an output terminal;
   first and second supply conductors for supplying electrical power at a substantially constant voltage between the conductors;
   a first voltage divider including first, second and third resistors connected in series between said first and second supply conductors;
   a second voltage divider including fourth and fifth resistors connected in series between said first and second supply conductors;
   a sensor terminal connected to the junction between the fourth and fifth resistors, the inverting input terminal of said first voltage comparator and the noninverting input terminal of said second voltage comparator;
   means connecting the noninverting input terminal of said first voltage comparator to the junction between the first and second resistors and connecting the inverting input terminal of said second voltage comparator to the junction between the second and third resistors;
   first and second diodes having their anodes connected to the output terminals of said first and second voltage comparators respectively;
   an optoelectronic isolator having an input section adapted to receive a driving signal and an output section adapted to produce a signal suitable for transmission on a data bus in response to a driving signal of substantially constant current; and
   a driving circuit connected between the cathodes of said first and second diodes and the input section of said optoelectronic isolator for supplying a substantially constant current driving signal thereto in response to current flowing from or into said sensor terminal.

9. A circuit for transforming signals produced by a sensor of either current sourcing or current sinking type into signals suitable for transmission on a data bus comprising:
   first and second supply conductors for supplying electrical power at a substantially constant voltage between the conductors;
   a sensor terminal for receiving sensor signals from a sensor of either current sourcing or current sinking type;
   a voltage divider including first and second resistors connected in series between said first and second supply conductors;
   a first NPN transistor and a PNP transistor having their emitters connected together and having their bases connected to the junction between the first and second resistors;
   a third resistor connected between the junction of the first and second resistors and the emitters of said first NPN transistor and said PNP transistor;
   first connecting means connecting the sensor terminal to the emitters of said first NPN transistor and said PNP transistor;
   second connecting means including a series connected Zener diode and fourth resistor connecting the collector of said first NPN transistor to said second supply conductor, said Zener diode being connected between said second supply conductor and said fourth resistor;
   a bias network including fifth and sixth resistors connected in series between the collector of said PNP transistor and said first supply conductor;
   a further NPN transistor having a base electrode connected to the junction between the fifth and sixth resistors, an emitter connected to the first supply conductor and a collector connected to the end of the fourth resistor toward said first NPN transistor;
   an optoelectronic isolator having an input section and an output section; and
   a constant current control signal source including said Zener diode and having a control terminal at the junction of said fourth resistor and said Zener diode, said control signal source further having an output terminal connected to the input section of said optoelectronic isolator, whereby sensor signals which cause current to flow either into or from said input terminal result in generation of signals at the output section of said optoelectronic isolator suitable for transmission on a data bus.

10. The circuit of claim 10 wherein said second connecting means includes a further diode connected in series between said fourth resistor and the collector of said first NPN transistor, the further diode being oriented with its cathode toward said further NPN transistor.

11. An electronic system comprising:
   a plurality of sensors, each sensor being of either a current sourcing or current sinking type;
   a data bus including a common conductor and a plurality of additional conductors, each additional conductor being dedicated to a separate sensor; and
   a plurality of interface circuits as defined in claim 1, each interface circuit connecting a separate one of said sensors to a separate one of the additional conductors in said data bus.

* * * * *

UNITED STATES PATENT AND TRADEMARK OFFICE
CERTIFICATE OF CORRECTION

PATENT NO. : 4,689,499

DATED : AUGUST 25, 1987

INVENTOR(S) : JIMMY YEE

It is certified that error appears in the above-identified patent and that said Letters Patent is hereby corrected as shown below:

Claim 10, line 1, delete "10" insert --9--.

Signed and Sealed this

Seventeenth Day of May, 1988

Attest:

DONALD J. QUIGG

Attesting Officer

Commissioner of Patents and Trademarks